United States Patent [19]

Berger et al.

[11] Patent Number: 4,897,287
[45] Date of Patent: Jan. 30, 1990

[54] METALLIZATION PROCESS FOR AN INTEGRATED CIRCUIT

[75] Inventors: Henry R. Berger; Gretchen M. Adema, both of Durham, N.C.

[73] Assignee: The BOC Group, Inc., New Providence, N.J.

[21] Appl. No.: 254,252

[22] Filed: Oct. 6, 1988

[51] Int. Cl.⁴ .................... B05D 5/12; H01L 21/285
[52] U.S. Cl. .................................... 427/96; 427/126.1; 427/255.2; 427/255.4; 437/190; 437/192; 437/200; 437/202
[58] Field of Search ............... 427/126.1, 96, 255.2, 427/255.4; 437/192, 189, 200, 202, 190

[56] References Cited

U.S. PATENT DOCUMENTS 4,640,004 3/1987 Thomas et al. .................... 437/190

FOREIGN PATENT DOCUMENTS 61-127124 6/1986 Japan .
62-111426 5/1987 Japan .

Primary Examiner—Norman Morgenstern
Assistant Examiner—Margaret Bueker
Attorney, Agent, or Firm—Carol Nemetz; R. Hain Swope; Larry R. Cassett

[57] ABSTRACT

A simple method for forming a metallization for an integrated circuit comprises depositing on a silicon substrate a first layer of refractory metal and nitrogen solid mixture and depositing thereon a second layer of refractory metal. The resulting structure is heated to convert the first layer to refractory metal nitride and the second layer to refractory metal silicide by flow of silicon from the substrate. By appropriate masking of the substrate, formation of silicide in the second layer can be blocked, thus permitting formation of self-aligned metallization by selective etching.

15 Claims, 2 Drawing Sheets

METALLIZATION PROCESS FOR AN INTEGRATED CIRCUIT

FIELD OF THE INVENTION

The present invention relates generally to semiconductor integrated circuit manufacturing and in particular to a method of forming a metallization for an integrated circuit.

BACKGROUND OF THE INVENTION

The use of advanced semiconductor processing techniques has resulted in a decrease in semiconductor device dimensions. This decrease in device size has resulted in an increased need for high density integrated circuit chip metallization for circuit interconnection contacts.

One technique of forming high density chip contacts is set forth in U.S. Pat. No. 4,640,004 issued Feb. 3, 1987 to Thomas et al. This technique comprises a process consisting of (a) providing a substrate; (b) placing a refractory metal and nitrogen layer on the substrate; (c) placing a refractory metal and silicon layer on the refractory metal and nitrogen layer; and (d) an annealing the structure. This technique, however, presents a number of shortcomings. This technique is unduly complex in that it requires the use of two codeposition steps. It also requires a separate photolithographic patterning step in order to form the integrated circuit chip contacts. In high density integrated circuit chips this photolithographic patterning step may create a registration problem in the chip contacts.

SUMMARY OF THE INVENTION

It is therefore an object of the present invention to provide for improved metallization process for an integrated circuit.

It is another object of the present invention to provide a method of forming a metallization for integrated circuit which is simpler than currently available methods.

It is further object of the present invention to provide for a metallization which is self-aligned with respect to the underlying substrate so as not to require separate patterning for integrated circuit chip contacts.

These and other objects which will become apparent are achieved in accordance with the present invention by codepositing a refractory metal and nitrogen on a substrate to form a first layer of refractory metal and nitrogen solid mixture on the substrate. Next, a refractory metal is deposited on the first layer, to form a second layer of refractory metal on the first layer. The resulting structure is then heated to convert the first layer into a refractory metal nitride and the second layer into a refractory metal silicide. The process may be simply performed in one chamber by evaporating the refractory metal on a substrate in a nitrogen flow and then stopping the flow of nitrogen into the chamber to form the second layer of refractory metal. Two codeposition steps are not required.

Moreover, when the substrate has a mask pattern of silicon dioxide or other barrier material selectively disposed on it the resulting metallization structure will be self-aligned to the exposed unmasked portions of the substrate, since the silicon dioxide will block the flow of silicon during the heating step. Consequently, separate photolithographic patterning is not required and registration problems are avoided.

Other objects, features and advantages of the present invention will become more fully apparent from the following detailed description of the preferred embodiment, the appended claims and the accompanying drawing.

DETAILED DESCRIPTION OF THE PREFERRED EMBODIMENT

Figure 1A:
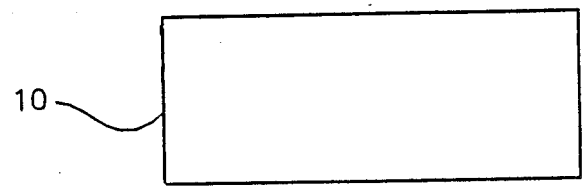
FIG. 1A–1C is a diagrammatic representation of the instant metallization process for a silicon substrate.

Although specific forms of the invention have been selected for illustration of the drawing, and the following description is drawn in specific terms for the purpose of describing these forms of the invention, this description is not intended to limit the scope of the invention which is defined in the appended claims.

Referring to FIG. 1A, there is shown, in diagrammatic form, layer 10 of silicon which will form a substrate for a device made in accordance with the process of the present invention. The silicon substrate 10 is prepared by conventional growth techniques. The silicon substrate 10 may be a polycrystaline substrate or a single crystal silicon substrate both doped according to device specifications. For example, appropriate dopants may be boron, phosphorous, arsenic, and borine.

Figure 1B:
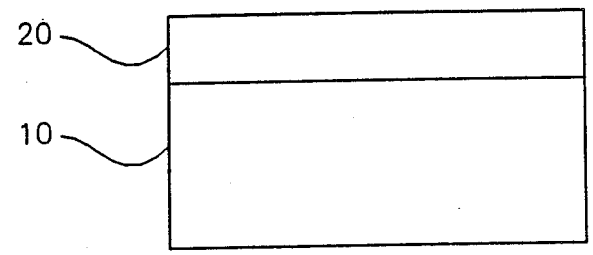

Referring now to FIG. 1B, there is shown, in diagrammatic form, layer 20 of refractory metal and nitrogen solid mixture disposed on the substrate 10. Refractory metal and nitrogen solid mixture layer 20 may be disposed on substrate 10 by codepositing the refractory metal and nitrogen on said substrate 10. Preferably, this codeposition occurs in a vacuum chamber, and may take place in a non-reactive ambient (e.g. argon). The preferred embodiment of the invention employs a pellet of refractory metal resistively heated to evaporation and a nitrogen flow into a vacuum chamber Alternatively, the deposition of layer 20 may also be achieved by exposing substrate 10 to a flow of refractory metal in a nitrogen containing ambient. Refractory metal may also be deposited through the use of standard evaporation, chemical vapor deposition, sputtering or E-beam deposition. While the use of the refractory metal titanium is preferred, the layer 20 may also be formed using other refractory metals such as tantalum, tungsten, palladium, molybdenum, niobium, zirconium, chromium or hafnium.

Preferably, layer 20 of refractory metal and nitrogen solid mixture is 900 angstroms thick and is deposited at a rate of 5 angstroms per second, while maintaining nitrogen partial pressure at $3 \times 10^{-5}$ mbar. The use of this pressure should be tuned to the deposition rate of the refractory metal used in order to achieve a desired mix of nitrogen and refractory metal. A complete reaction during the heating or annealing of the refractory metal and nitrogen is dependent upon the ratio of Ti:N in the system which prevents too much or too little nitrogen from reacting. If too little nitrogen is used, a nitride does not form in layer 20 and, during heating of the structure, layer 20 will convert to refractory metal silicide. If too much nitrogen is in the system a refractory metal silicide cannot be formed in layer 30. Consequently, the nitrogen pressure in the system must be carefully monitored for the proper reactions to occur. Note that other suitable nitrogen bearing gases may be used in this method as a substitute for nitrogen (i.e. ammonia).

Figure 1C:
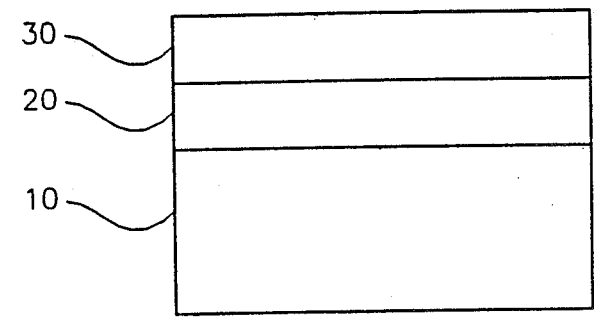

Referring now to FIG. 1C, there is shown, in diagrammatic form, a layer 30 of refractory metal. Refractory metal layer 30 is deposited at a rate of 5 angstroms per second until approximately 1,000 angstroms are deposited. This deposition preferably occurs through evaporation of the refractory metal on layer 20. The atmospheric pressure in the reaction chamber is preferably as low as the system can attain during deposition of layer 30.

Preferably, the refractory metal and nitrogen are codeposited on the substrate to form a layer of refractory metal and nitrogen solid mixture 20 and when the desired thickness of layer 20 is achieved, codeposition of the nitrogen is terminated while the deposition of the refractory metal continues to form a second layer of the refractory metal 30 on layer 20.

The structure of FIG. 1C is then heated to form refractory metal silicide on layer 30 and refractory metal nitride on layer 20. The structure is heated at a temperature and for a time sufficient for these reactions to take place, preferably for 35 minutes at 800° C. in a high purity furnace. Rapid thermal annealing may also be used to achieve this reaction. Preferably, the wafers are annealed using high purity argon as an unreactive ambient. The heating converts the refractory metal and nitrogen solid mixture layer 20 to a refractory metal nitride and converts the layer of refractory metal 30 to a refractory metal silicide. As the structure is heated, silicon from the substrate 40 diffuses through layer 20 without reacting with the refractory metal nitrogen solid mixture. The silicon then diffuses to layer 30 and chemically reacts with the refractory metal to form refractory metal silicide.

Since refractory metal nitride will block the diffusion of silicon through layer 20, it is believed that in this process the silicon diffuses through layer 20 before layer 20 is converted to refractory metal nitride. Thus allowing for the diffusion of silicon through to layer 30.

As a result, a metallization process for an integrated circuit is achieved using only one codeposition and one heating step.

Figure 2A:
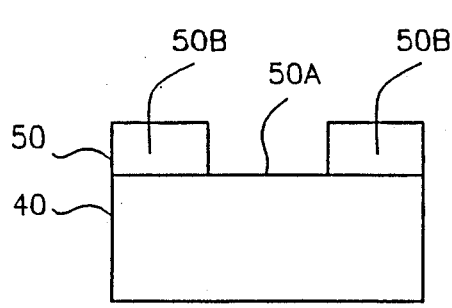
FIGS. 2A–2E is a diagrammatic representation of the instant process resulting in a self-aligned metallization for a silicon substrate.

Referring now to FIG. 2A, self-alignment of the integrated circuit metallization can be achieved by first placing barrier layer 50 on the silicon substrate 40 and patterning layer 50 by conventional techniques to form barrier masks 50B and exposed areas of the underlying substrate 50A. The barrier masks 50B are preferably silicon dioxide but may be formed of other materials which block the flow of Si from substrate layer 40 (e.g. $Si_3N_4$).

Figure 2B:
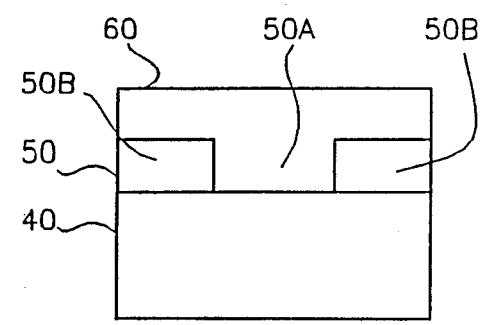

Referring now to FIG. 2B, a layer of refractory metal and nitrogen solid mixture is deposited on the masks 50B and substrate 40 in the same manner as the deposition of nitrogen solid mixture layer 20 on silicon substrate 10 in Fig. 1B.

Figure 2C:
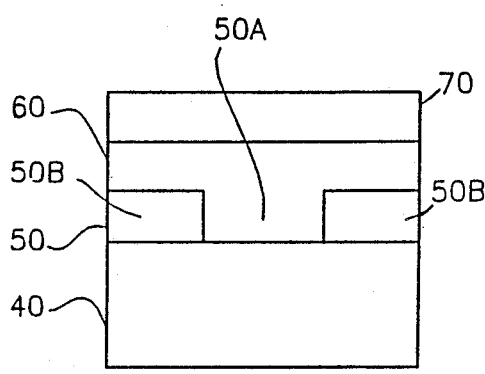

Referring now to FIG. 2C, refractory metal layer 70 is deposited on refractory metal and nitrogen solid mixture layer 60 in the same manner as the deposition of refractory metal layer 30 on layer 20 in FIG. 1C.

Figure 2D:
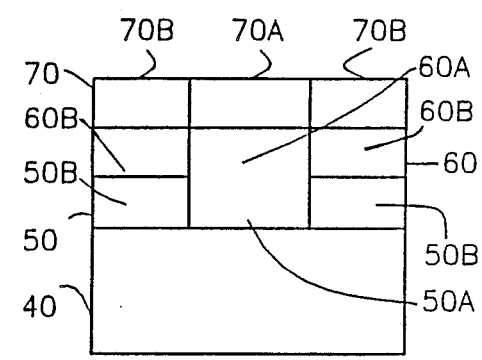

Referring now to FIG. 2D, first areas 70A of refractory metal layer 70 and 60A of refractory metal and nitrogen solid mixture layer 60 which are located above the exposed portions 50A of the substrate 40 are shown. In addition, second areas 70B of the refractory metal layer 70 and 60B of refractory metal and nitrogen solid mixture layer 60 above the covered portions 50B of the substrate 40 are shown.

The structure of FIG. 2D is heated to convert the first areas 70A of the refractory metal layer 70 and 60A of refractory metal and nitrogen solid mixture layer 60 to a refractory metal silicide and refractory metal nitride, respectively, while the second areas 70B of refractory metal layer 70 remain refractory metal and second areas 60B of layer 60 are converted to refractory metal nitride. The second areas 70B of layer 70 remain refractory metal rather than converting into refractory metal silicide due to the barrier masks 50 blocking flow of silicon through the structure to refractory metal layer 70.

To perform the conversion of layer 60 and first areas 70A of layer 70 the structure of FIG. 2D is heated at a temperature high enough to convert first areas 70A of layer 70 to refractory metal silicide and to convert layer 60 to refractory metal nitrite. Preferably, the structure is heated at a temperature and for a time sufficient for these reactions to take place. Preferably, the heating occurs at a temperature of 800° centigrade for 35 minutes in a high purity furnace in an argon ambient. However, rapid thermal annealing may also be used to achieve the desired reactions.

Figure 2E:
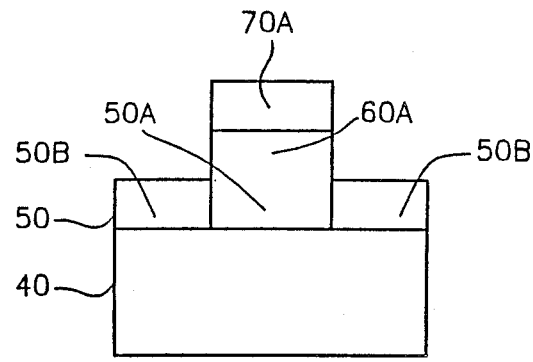

Next, self-aligning of the metallization of FIG. 2D is achieved by removing second areas 70B and 60B. Preferably, a wet etchant, consisting of a 1:1:5 mixture of $NH_4OH:H_2O_2:H_2O$, is used to remove second areas 70B and 60B consisting of the unreacted refractory metal of layer 70 and the refractory metal nitride second areas 60B of layer 60. In addition, this etchant will remove any surface titanium oxy-nitride film which may have formed on the refractory metal silicide over the first area 70A where the silicon has been reacted. The result of this process is shown in FIG. 2E. Thus a self-aligned metallization for an integrated circuit chip is formed without the need for a photolithographic patterning.

It will be understood that various changes in the details, materials and arrangement of the parts which have been herein described and illustrated in order to explain the nature of this invention, may be made by those skilled in the art within the principle and scope of the invention as expressed in the following claims.

What is claimed is:

1. A metallization process for a silicon substrate comprising the steps of:
    codepositing a refractory metal and nitrogen on said substrate to form a first layer of refractory metal and nitrogen solid mixture on said substrate;
    depositing a refractory metal on said first layer, to form a second layer of refractory metal on said first layer; and
    heating to convert said first layer into refractory metal nitride and said second layer into refractory metal silicide.

2. The process of claim 1 wherein said refractory metal is titanium.

3. The process of claim 1 wherein said heating step comprises the step of heating at a temperature high enough to cause annealing.

4. The process of claim 1 wherein said codepositing step comprises the step of evaporating said refractory metal in a nitrogen containing ambient.

5. The process of claim 1 wherein said codepositing step is preceded by the step of:

selectively masking said substrate to create covered portions and exposed portions thereof;

and wherein said heating step converts first areas of said second layer above said exposed portions of said substrate to refractory metal silicide with second areas of said second layer above said covered portions of said substrate remaining refractory metal.

6. The process of claim 5 further comprising the step of removing said second areas of said second layer and the portion of said first layer which underlies said second areas of said second layer.

7. The process of claim 5 wherein silicon dioxide is used to selectively mask said substrate.

8. A metallization process for a silicon substrate comprising the steps of:
codepositing a refractory metal and nitrogen on said substrate, to form a first layer of a refractory metal and nitrogen solid mixture thereon;
terminating the codeposition of nitrogen and continuing to deposit said refractory metal to form a second layer of said refractory metal on said first layer; and
heating to convert said first layer into refractory metal nitride and said second layer into refractory metal silicide.

9. The process of claim 8 wherein said heating step comprises the step of heating at a temperature high enough to cause annealing.

10. The process of claim 8 wherein said codepositing step comprises the step of evaporating said refractory metal in a nitrogen containing ambient.

11. The process of claim 8 wherein said codepositing step is preceded by the step of:
selectively masking said substrate to create covered portions and exposed portions thereof;
and wherein said heating step converts first areas of said second layer above said exposed portions of said substrate to refractory metal silicide with second areas of said second layer above said covered portions of said substrate remaining refractory metal.

12. The process of claim 11 further comprising the step of removing said second areas of said second layer and those portions of said first layer which underlie said second areas of said second layer.

13. A metallization process for a silicon substrate comprising the steps of:
evaporating a refractory metal on said substrate, in a nitrogen flow, to form a first layer of refractory metal and nitride solid mixture on said substrate;
terminating said nitrogen flow to thereby form a second layer of refractory metal on said first layer;
terminating the evaporation of said refractory metal; and
annealing to convert said first layer into refractory metal nitride and/said second layer into refractory metal.

14. The process of claim 13 wherein said evaporating step is preceded by the step of:
selectively masking said substrate to create covered portions and exposed portions thereof;
and wherein said annealing step converts first areas of said second layer above said exposed portions of said substrate to refractory metal silicide with second areas of said second layer above said covered portions of said substrate remaining refractory metal.

15. The process of claim 14 further comprising the step of removing said second areas of said second layer and those portions of said first layer which underlie said second areas of said second layers.

* * * * *